(12) United States Patent
Wuerstlein et al.

(10) Patent No.: US 7,821,275 B2
(45) Date of Patent: Oct. 26, 2010

(54) ANTI-PINCH SENSOR

(75) Inventors: Holger Wuerstlein, Zeil am Main (DE); Thomas Weingaertner, Memmelsdorf (DE); Wolf-Christian Mueller, Heidelberg (DE)

(73) Assignee: Brose Fahrzeugteile GmbH & Co. Kommanditgesellschaft, Coburg (DE)

( * ) Notice: Subject to any disclaimer, the term of this patent is extended or adjusted under 35 U.S.C. 154(b) by 0 days.

(21) Appl. No.: 12/422,691

(22) Filed: Apr. 13, 2009

(65) Prior Publication Data

US 2009/0256578 A1 Oct. 15, 2009

Related U.S. Application Data

(63) Continuation of application No. PCT/EP2007/008566, filed on Oct. 2, 2007.

(30) Foreign Application Priority Data

Oct. 13, 2006 (DE) ............... DE20 2006 015740 U

(51) Int. Cl.
*G01R 27/26* (2006.01)

(52) U.S. Cl. ............... 324/663; 324/659; 340/562; 340/870.37; 345/173

(58) Field of Classification Search .................. 324/663
See application file for complete search history.

(56) References Cited

U.S. PATENT DOCUMENTS

| | | | |
|---|---|---|---|
| 5,166,679 A * | 11/1992 | Vranish et al. ......... | 340/870.37 |
| 6,310,611 B1 | 10/2001 | Caldwell | |
| 6,337,549 B1 | 1/2002 | Bledin | |
| 6,348,862 B1 * | 2/2002 | McDonnell et al. ......... | 340/562 |
| 6,445,294 B1 * | 9/2002 | McDonnell et al. ......... | 340/562 |
| 6,577,023 B1 * | 6/2003 | Stanley et al. ............... | 307/10.1 |
| 6,583,676 B2 * | 6/2003 | Krah et al. .................... | 331/74 |
| 6,936,986 B2 | 8/2005 | Nuber | |
| 6,972,575 B2 * | 12/2005 | Lambert et al. ............. | 324/658 |
| 2002/0015024 A1 * | 2/2002 | Westerman et al. ......... | 345/173 |
| 2004/0172879 A1 | 9/2004 | Regnet et al. | |
| 2006/0120573 A1 * | 6/2006 | Iori ............................ | 382/124 |
| 2007/0120831 A1 * | 5/2007 | Mahowald et al. .......... | 345/173 |
| 2007/0125172 A1 * | 6/2007 | Vanderzee ................ | 73/304 C |

FOREIGN PATENT DOCUMENTS

| | | |
|---|---|---|
| DE | 40 06 119 A1 | 8/1991 |
| EP | 1 154 110 A2 | 11/2001 |
| EP | 1 371 803 A1 | 12/2003 |
| EP | 1 450 489 A1 | 8/2004 |
| EP | 1 455 044 A2 | 9/2004 |
| WO | WO 97/29391 | 8/1997 |

\* cited by examiner

*Primary Examiner*—Jeff Natalini
*Assistant Examiner*—Benjamin M Baldridge
(74) *Attorney, Agent, or Firm*—Muncy, Geissler, Olds & Lowe, PLLC

(57) ABSTRACT

An anti-pinch sensor, particularly for detecting an obstacle in the path of an actuating element of a motor vehicle is provided, having a sensor body, a measuring electrode, which is disposed in the sensor body and to which a measuring potential can be applied, a calibrating electrode, which is electrically disconnected and disposed in the sensor body adjacent to the measuring electrode, and a control unit. The control unit controls the measuring electrode and the calibrating electrode such that the measuring potential and the calibrating potential are equal in a measuring phase, and differ from each other in a calibrating phase.

17 Claims, 2 Drawing Sheets

ANTI-PINCH SENSOR

This nonprovisional application is a continuation of International Application No. PCT/EP2007/008566, which was filed on Oct. 2, 2007, and which claims priority to German Patent Application No. DE 20 2006 015 740.9, which was filed in Germany on Oct. 13, 2006, and which are both herein incorporated by reference.

BACKGROUND OF THE INVENTION

1. Field of the Invention

The invention relates to an anti-pinch sensor, particularly for detecting an obstacle in the path of an actuating element of a motor vehicle.

2. Description of the Background Art

Conventional anti-pinch sensors utilize, for example, the capacitive measuring principle to detect an obstacle. In this case, an electric field is created between a measuring electrode and a suitable counter electrode. If a dielectric enters this electric field, the capacitance of the capacitor formed by the measuring electrode and the counter electrode changes. In this way, theoretically, an obstacle in the path of an actuating element of a motor vehicle can be detected, provided its relative dielectric constant $\in_r$ differs from the relative dielectric constant of air. The obstacle in the path of an actuating element is detected without physical contact with the anti-pinch sensor. If a change in capacitance is detected, countermeasures, such as, for example, stopping or reversing of the drive, can be initiated in a timely fashion, before actual pinching of the obstacle occurs.

In the case of actuating elements of a motor vehicle, this may refer, for example, to an electrically actuated window, an electrically actuated sliding door, or an electrically actuated trunk lid. An anti-pinch sensor, based on the capacitive measuring principle, may also be used to detect an obstacle in the case of an electrically actuated seat.

Non-contact anti-pinch sensors, based on the capacitive measuring principle, are known, for example, from European Pat. Applications Nos. EP 1 455 044 A2, which corresponds to U.S. Publication No. 20040172879, and EP 1 154 110 A2, which corresponds to U.S. Pat. No. 6,337,549. These prior-art anti-pinch sensors generate an external electric field by means of a measuring electrode and a suitable counter electrode, so that a dielectric entering this external electric field may be detected as a change in capacitance between the measuring electrode and counter electrode. To be able to assure a high reliability in the detection of pinching, in addition in the two prior-art anti-pinch sensors the distance between the measuring electrode and counter electrode is designed as flexible, as a result of which physical contact between an obstacle and the anti-pinch sensor can also be detected as a change in capacitance.

European Pat. Application No. EP 1 371803 A1, which corresponds to U.S. Pat. No. 6,936,986 discloses an anti-pinch sensor based on the capacitive measuring principle. In this case, a sensor electrode, which is connected via a shielded line to an evaluation unit, is used to generate an electric field within the opening range of the actuating element. The electric field is generated here relative to the body of a motor vehicle as the counter electrode.

A disadvantage of the prior-art anti-pinch sensors, based on the capacitive measuring principle, is the risk of misdetection of pinching, when there is dirt or water on the sensor. Dirt or water also leads to an altered capacitance, so that a conclusion on an instance of pinching would be erroneously reached.

SUMMARY OF THE INVENTION

It is therefore an object of the invention to provide an anti-pinch sensor operating according to the capacitive measuring principle of the aforementioned type, with which the risk of misdetection in the case of deposition of dirt or water is as low as possible.

This object is achieved by the invention by an anti-pinch sensor of the aforementioned type, which comprises a sensor body with a measuring electrode, which is disposed in the sensor body and to which a measuring potential can be applied, and an electrically isolated calibrating electrode, which is disposed in the sensor body adjacent to the measuring electrodes and to which a calibrating potential can be applied, and a control unit, whereby the control unit is set up to control the measuring electrode and the calibrating electrode in such a way that the measuring potential and the calibrating potential are equal in a measurement phase and differ from one another in a calibration phase.

An aspect of the invention is based on the consideration of dividing an electrode, provided essentially to generate an external field, into electrically isolated electrodes; this makes possible a detection and compensation of a deposit formed by dirt or water on the surface of the sensor body. The same or a different potential can be applied to the electrically isolated electrodes according to the invention, namely, a measuring electrode and a calibrating electrode.

In the measurement phase, the same potential is applied to both electrodes, so that overall an electric field, called the measuring field hereinafter, relative to a counter electrode forms to detect an obstacle in the path of the actuating element. No electric field forms thereby between the electrodes, so that both electrodes function as a single electrode, whose surface area is made up of the surface areas of the measuring and calibrating electrodes. The counter electrode in this case can be part of the anti-pinch sensor itself, or it can also be formed by the grounded body of a motor vehicle. A dielectric entering the measuring field can be detected particularly from a change in the capacitance of the capacitor formed by the measuring and calibrating electrodes and the counter electrode.

Dirt or water, which as deposits or wetting impacts the surface of the sensor body, is characterized by a dielectric constant that differs from that of air. Therefore, such a deposit on the sensor surface causes a change in the electric field produced in the measurement phase and thus in the capacitance of the capacitor comprising the measuring and calibrating electrodes and the counter electrode. This change in capacitance can be erroneously interpreted as caused by an obstacle, and as a malfunction can lead to the initiation of a reversing process of the actuating element.

The separation into a measuring and a calibrating electrode, however, makes it possible to differentiate a near-field change caused by a deposit on the sensor surface from a far-field change due to an obstacle. To this end, different potentials are applied to the measuring electrode and the calibrating electrode in the calibration phase. This has the result that an electric field, also called a calibration field hereinafter, forms between the measuring electrode and the calibrating electrode. In addition to a direct field, a stray field with a small spread also forms hereby, whose field lines penetrate the surface of the sensor body. The calibration field overall has a small spatial spread due to the adjacent arrangement of the electrodes. Thus, the size of the calibration field is affected particularly by a deposit on the sensor surface. It is therefore possible by generating the calibration field to determine directly the near-field effect caused by a deposit on the sensor surface and to use it for compensating the measurement by means of the measuring field, which due to a rather great spatial spread (distance to the counter electrode) is influenced both by a deposit in the near field and by an obstacle in the far field.

The different ranges of the measuring and calibration field can be influenced in this case by the geometry and/or dimensioning of the capacitor arrangements, which arise in the measurement and calibration phase. Thus, for example, to achieve as short-range a calibration field as possible, the calibrating electrode can be designed in such a way that the field lines have as direct a course as possible between the calibrating electrode and the measuring electrode. For example, the surface area of the calibrating electrode can also be formed as small relative to the measuring electrode.

The setting of the measurement phase and the calibration phase or the change between the two phases can occur both automatically, particularly at predefined time intervals, and also as needed. In the first case, for example, switching between the phases can occur periodically by suitable control. In the second case, calibration of the anti-pinch sensor by a user can occur, particularly in an erroneous interpretation of a deposit or wetting of the sensor surface as an obstacle.

Pinching is typically detected proceeding from the detection of a field change in the measuring field, particularly by measuring the capacitance, when the change exceeds a predefined triggering threshold compared with the expected value. So that a change due to soiling or wetting of the sensor surface does not lead to an undesired misinterpretation as pinching and therefore in a problematic stopping or reversing of the actuating element, without there being an obstacle in the path of travel, it is necessary to track or update the triggering threshold at certain time intervals. Therefore, according to a preferred embodiment, the control unit is set up to detect and store a calibration capacitance during the calibration phase and to take into account said calibration capacitance in the evaluation of a measurement capacitance detected in the measurement phase. A near-field change due to dirt or water deposits is therefore measured during the calibration phase via the capacitance between the calibrating and measuring electrodes. Because the measuring field is also affected by deposits on the sensor surface, the change in the calibration capacitance can be used for calibrating the measurement capacitance. The effect of the calibration capacitance on the measurement capacitance can be derived or determined experimentally for this purpose from theoretical considerations, which include, for example, geometric aspects. With a change in the calibration capacitance, in comparison with its last stored value, the triggering threshold itself or the expected value, relative to which the triggering value is defined, is redetermined to avoid misinterpretation of the detected measurement capacitance.

The tracking of the triggering threshold can occur basically in different ways. On the one hand, software-based tracking of the triggering threshold can occur in that the control unit adjusts the expected value of the measurement capacitance according to the measured calibration capacitance, as a result of which also the range of the triggering threshold, which follows the expected value of the measurement capacitance, shifts, or in that a new current value or a new course for the triggering threshold, which is used in the evaluation of the measurement capacitance, is determined directly after a change in the calibration capacitance. As an alternative, the tracking can also occur electronically by means of suitable electronic switching means. In this case, the electronic processing is influenced by the hardware, for example, by means of controllable elements, such that the same signal for normal operation and for pinching is always supplied to the control unit that detects pinching, regardless of the altered measurement capacitance.

If the measurement capacitance is detected, for example, by means of a bridge circuit, it is an option to connect a second bridge branch of identical design in parallel as reference and to detect as the measuring signal the difference in the voltages tapped between the resistance and capacitance, or their amplitudes or opposite phase position. A standard signal equal to zero, and in an instance of pinching, a pinching signal not equal to zero, can be generated in this way as a rule, so that it is possible to easily differentiate pinching from a normal case in an electronic manner, for example, by means of a comparator. This makes it possible, furthermore, to supply a digital signal to the control unit as a detection signal. The use of a controllable capacitance, particularly a controllable capacitance diode, is an option for adjusting the two bridge branches. It is possible to track the triggering threshold of a measurement capacitance changed by deposits by regulation of the capacitance diode by means of the control unit.

According to an embodiment, the control unit is set up to control the measuring electrode and the calibrating electrode each with an AC voltage, whereby the AC voltages differ from one another in their phases or in their frequencies. It is achieved in both cases that the measured total capacitance or partial capacitances contain parts of both the measurement phase and the calibration phase. When two AC voltages with a different phase or frequency are used to control the electrodes, in fact the potential difference varies periodically with time both between the two electrodes and also relative to the counter electrode. A conclusion can therefore be reached about the measurement capacitance and calibration capacitance from the time course of the measured capacitance or capacitances. Thus, a change between the measuring and calibration phase can be achieved by simple means, so that a cost-effective and simple compensation of dirt or water deposits on the sensor surface is achieved.

For reliable detection of a deposit or wetting, it is advantageous to detect the calibration field, when the potential difference between the electrodes is the greatest. Therefore, the control unit is preferably set up to use as a measurement phase a range in which the amplitudes of the AC voltages are substantially equal and to use as the calibration phase a range in which the amplitudes of the AC voltages are as different as possible.

As an alternative to supplying the electrodes with AC voltages of a different phase or frequency, in the calibration phase the measuring electrode is preferably connected to a ground potential, particularly to ground. The greatest potential difference possible between the measuring and calibrating electrodes is established by connecting the measuring electrode to ground, so that an especially intense calibration field forms.

The control unit can be formed as a microcontroller, which is used particularly during the software-operated tracking of the triggering threshold.

In an embodiment of the invention, the electrodes are each formed flat and the surface area of the measuring electrode is greater than the surface area of the calibrating electrode. The measurement and calibration capacitance is determined or adjusted via the size of the surface areas in a known manner. In particular, the range of the measuring field extending into the opening range can also be increased by increasing the surface area of the measuring electrode. A capacitance adjustment, desired for evaluating the change in capacitance, in the measuring and calibration fields can be achieved by a combination of arrangement and dimensioning; here, in particular the later use of the anti-pinch sensor and thereby the geometry of a vehicle body are also to be considered.

In another embodiment, the measuring electrode and the calibrating electrode are designed comb-shaped, whereby the comb structures of the calibrating electrode and measuring electrode interdigitate. This enables the detection of a non-homogeneous water or dirt distribution on the sensor surface. A dirt or water deposit in the vicinity of the interdigitating teeth of the comb structures influences the capacitance between the measuring and calibrating electrode differently than a deposit at a distance therefrom. Thus, a position resolution can be achieved hereby transverse to the sensor longitudinal direction.

To prevent the field lines from the calibrating electrode in the calibration phase from orienting themselves directly to the counter electrode, two measuring electrodes, particularly two structurally identical measuring electrodes, can be provided, which are disposed in the edge regions of the sensor body, so that the calibrating electrode is positioned between said two electrodes. Due to this arrangement, the field lines of the calibration field extend from the calibrating electrode in the direction of the measuring electrodes disposed at the edges and the calibration field forms at least in part beyond the sensor body. Alternatively, however, two calibrating electrodes can also be provided at the edge of the sensor, said electrodes which adjoin the centrally positioned measuring electrode. In the case of the design as comb-shaped structures, the central electrode is designed as a double comb, which combs bilaterally with the outer comb structures of the additional electrodes.

To achieve a useful electric field with a broad range, in an expedient embodiment, a separate shielding electrode is provided in the sensor body; the electrode can be formed to direct the measuring field into a hazard region in the measurement phase by applying the same potential to it as to the measuring and calibrating electrodes. If, for example, the body of a motor vehicle is used as the counter electrode, on which the anti-pinch sensor is placed, then the separate shielding electrode is to be disposed between the vehicle body and the electrodes in the sensor body. A potential equalization between the potential, at which the measuring and calibrating electrodes are in the measurement phase, and the potential of the shielding electrode has the result that no direct electric field and therefore no direct capacitance form between the electrodes and the counter electrode. Rather, the field lines of the electric field between the electrodes and the counter electrode are directed into the hazard region to be detected.

In the case of a measuring electrode and a calibrating electrode, a shielding electrode extends advantageously in a flat manner completely under both electrodes. In the measurement phase, all electrodes are then at the same potential, as a result of which the measuring field extends far into the hazard region. In the calibration phase, the measuring electrode is supplied with ground or the ground potential. The shielding electrode in this case is at the same potential as the calibrating electrode. This has the result that the calibration field extends into the near zone.

Apart from the shielding electrode, an additional electrode can be provided, which is disposed between the measuring electrode and calibrating electrode and to which the same potential can be applied as to the calibrating electrode. The additional electrode prevents the formation of a direct electric field between the measuring and calibrating electrodes and increases the proportion of the stray field, so that a large part of the field lines of the calibration field in the calibration phase favorably run through the sensor body outward and thus enable the detection of deposits on the surface of the sensor body, i.e., in a near zone.

In a simple embodiment, the shielding electrode is designed as a coherent flat conductor. In an advantageous embodiment, however, the shielding electrode is divided into individual, separated single shielding electrodes, each arranged opposite the electrodes. This permits better potential equalization relative to the individual electrodes to be shielded. In particular, it is possible hereby to provide two types of single shielding electrodes, namely, those that are used to shield the measuring electrode and are always at the same potential as the measuring electrode, and those that are at the same potential as the calibrating electrode. Thus, it is prevented in the calibration phase that a direct electric field forms between the measuring or calibrating electrode and the counter electrode.

In an embodiment, the sensor body is made of a flexible support material. This permits running the anti-pinch sensor easily along the contour of a closing edge of a motor vehicle. In particular, the sensor body can be formed as a flexible flat cable. It is just as readily conceivable to design the sensor body as a sealing body or to integrate the sensor body into a sealing body. The sealing body is provided thereby to seal the actuating element relative to the closing edge in the closed state. A sealing lip can be mentioned as an example of this, which seals an actuatable side window of a motor vehicle relative to its closing edge.

Further, the anti-pinch sensor can be formed as a flexible flat cable. A flexible flat cable is also called an FFC and is notable in that parallel conductor structures are laid out in a flexible cable body.

As an alternative to an FFC, a flexible conductor structure may also be used as the sensor body. A flexible conductor structure is also known under the term FPC (flexible printed circuit). In this case, traces are specifically arranged or laid out in a flexible insulating material, particularly in a multilayer arrangement. This type of design permits high flexibility with respect to the dimensioning and arrangement of the individual traces, so that the measuring electrodes of the anti-pinch sensor can be arranged or dimensioned in a desired manner.

In another embodiment, the sensor body can extend in a longitudinal direction, whereby the electrodes are divided along the longitudinal direction each into individually controllable single electrodes. It is achieved hereby that the capacitance measurable between the measuring or calibrating electrode and the counter electrode declines, because the entire surface area of the measuring or calibrating electrode is divided into several interrupted individual surface areas of the separated electrodes. A low capacitance, forming overall between the electrodes in the sensor body and counter electrode, however, has the result that a small change in capacitance relative to the total capacitance can be detected more easily. The ratio of the change in capacitance and total capacitance shifts in favor of the change in capacitance. An anti-pinch sensor designed in this way, moreover, allows the detection of a change in capacitance by means of a multiplex process. In this case, the individual electrodes can be controlled by means of separate lines either displaced in time (serially) or simultaneously (parallel). Overall, a position resolution of dirt or water detection in the longitudinal direction of the sensor is also enabled with this arrangement.

The sensor can be used in a simple manner to detect an obstacle in the path of an actuating element of a motor vehicle, when the grounded body of the motor vehicle serves as the counter electrode. To this end, the described sensor is run along the contours of the motor vehicle in such a way that the shielding electrode comes to lie between the body and the electrodes. The capacitance formed between the electrodes and the grounded vehicle body is detected hereby. The sensor is preferably arranged on a movable part of the actuating element, for example, on a trunk lid of the motor vehicle, but it can also be arranged on a body region opposite the trunk lid.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
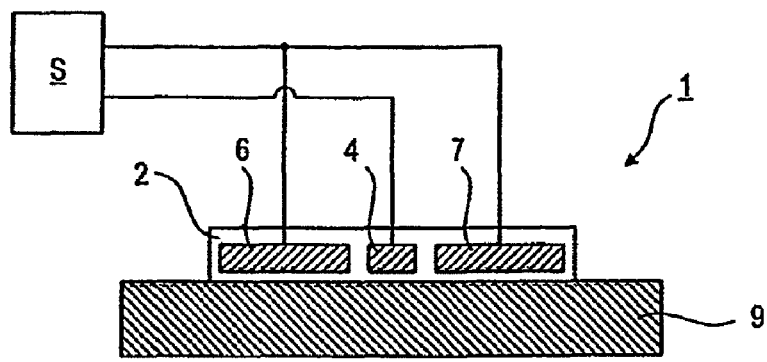
FIG. 1 is a cross section of an anti-pinch sensor, arranged on a counter electrode.

FIG. 1 shows schematically the cross section of an anti-pinch sensor 1, which can be used in particular for detecting an obstacle in the path of an actuating element of a motor vehicle. Anti-pinch sensor 1 comprises an elongated sensor body 2 made of an electrically insulating material. A calibrating electrode 4 is disposed approximately centrally between two structurally identical measuring electrodes 6, 7 in sensor body 2. Electrodes 4, 6, and 7 are each formed as flat conductors, which extend perpendicular to the plane of the drawing. Anti-pinch sensor 1 is placed on a counter electrode 9, which, for example, is formed by the grounded body of a motor vehicle.

To use anti-pinch sensor 1, electrodes 4, 6, and 7 are supplied by the control unit S with an AC voltage to ground, for example, relative to counter electrode 9. In this case, electrodes 4, 6 and 7 are connected electrically parallel to one another in a measurement phase, in which an obstacle in the path of the actuating element is to be detected, and are therefore always at the same electrical potential. Based on the potential difference between measuring electrodes 4, 6, and 7 and counter electrode 9, a direct electric field forms in insulating body 2 and a weaker external electric field in the space facing away from counter electrode 9. Electrodes 4, 6, and 7 each form a capacitor with counter electrode 9 with a characteristic measurement capacitance determined by the dimensioning of anti-pinch sensor 1. In this case, electrodes 4, 6, and 7 can be regarded as a single electrode because of their parallel connection.

The field lines of the stray field of the capacitor formed by counter electrode 9 and electrodes 4, 6, and 7 proceed along a curved path to both sides over the side of sensor body 2, said side facing away from counter electrode 9, to counter electrode 9. Thus, a dielectric approaching anti-pinch sensor 1 from the far zone is penetrated by the field lines, which results in a detectable change in capacitance between electrodes 4, 6, 7 and the counter electrode.

Figure 5:
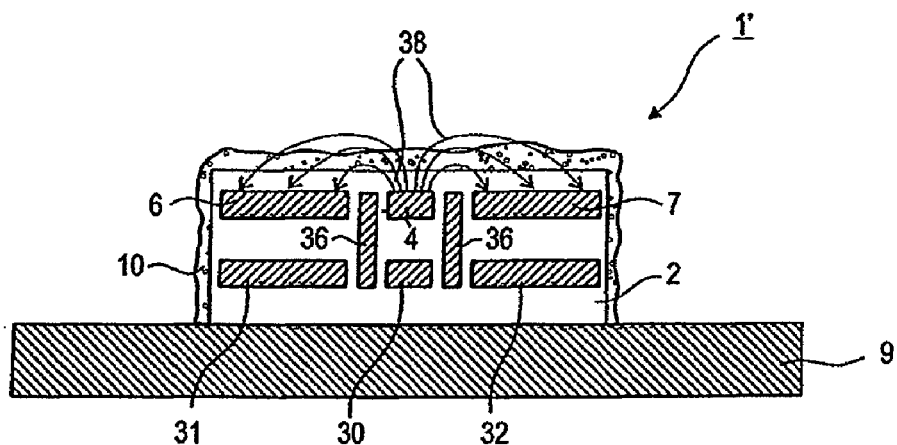
FIG. 5 illustrates in a cross section schematically the anti-pinch sensor of FIG. 4 with the course of the field lines in a calibration phase.

Control unit S, furthermore, is set up to apply a potential to calibrating electrode 4 in a calibration phase, a potential that is different from the potential of measuring electrodes 6 and 7. The then changed field line course in the calibration phase can be derived analogously from FIG. 5.

Figure 2:
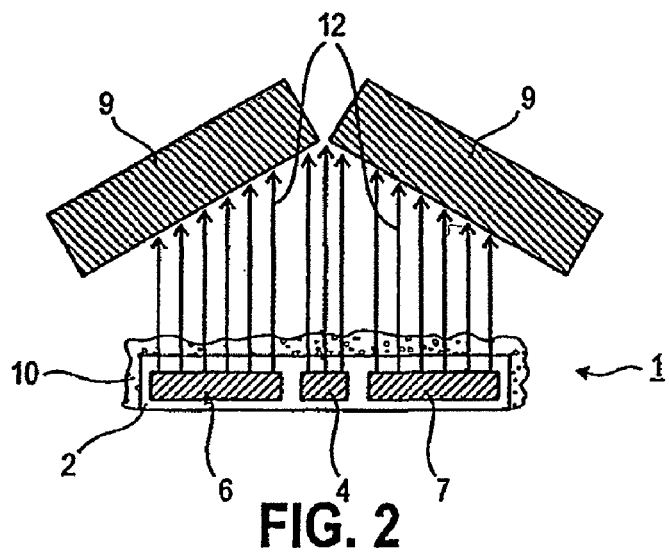
FIG. 2 illustrates schematically the anti-pinch sensor of FIG. 1 with a simplified depiction of field lines of the external electric field generated to the counter electrode.

In FIG. 2, the field configuration of anti-pinch sensor 1 of FIG. 1 is shown in a simplified diagram. In this case, for better understanding, counter electrode 9 is divided conceptually in the center below anti-pinch sensor 1 of FIG. 1 and the resulting halves are folded upward.

A straight course of the field lines of the external electric fields arising in the measurement phase results from this simplified depiction.

For illustration, a film of water 10 is further depicted on the surface of sensor body 2 of anti-pinch sensor 1 as soiling. The field line course of measuring field 12 is evident, which forms at a potential difference between counter electrode 9 and electrodes 4, 6, and 7.

In this schematic depiction, the direct capacitance, definitive for the shown anti-pinch sensor 1, between measuring electrodes 4, 6, and 7, and counter electrode 9 are eliminated conceptually and graphically. The depicted course of the field lines corresponds to that of the external, rather weak stray field.

Figure 3:
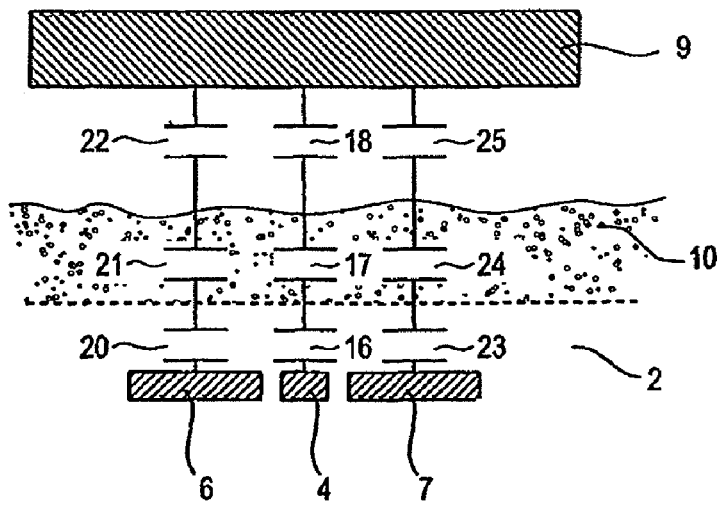
FIG. 3 illustrates a diagram of the resulting capacitances in the case of a wetted anti-pinch sensor of FIG. 1.

The structure of the measurement capacitances of the capacitor formed by respective electrodes 4, 6, and 7 and counter electrode 9 is vividly clear from the depiction according to FIG. 2. This is shown in a diagram in FIG. 3.

Calibration electrode 4, measuring electrodes 6 and 7, and the "folded" counter electrode 9 are again seen. A water film 10 is again present on electrodes 4, 6, and 7 or on sensor body 2 in the form of planar wetting.

It is understandable that each capacitance of electrodes 4, 6, and 7 with counter electrode 9 is made up of three single capacitances connected in series in terms of circuitry. The material of sensor body 2, water film 10, and air as a transmission medium are arranged between each electrode 4, 6, and 7 and counter electrode 9. In this respect, the capacitance of the capacitor comprising calibrating electrode 4 can be regarded as a series connection of capacitances 16, 17, and 18. Accordingly, the capacitances formed by outer measuring electrodes 6 and 7 can each be considered as a series connection of capacitances 20, 21, and 22 or 23, 24, and 25.

Figure 4:
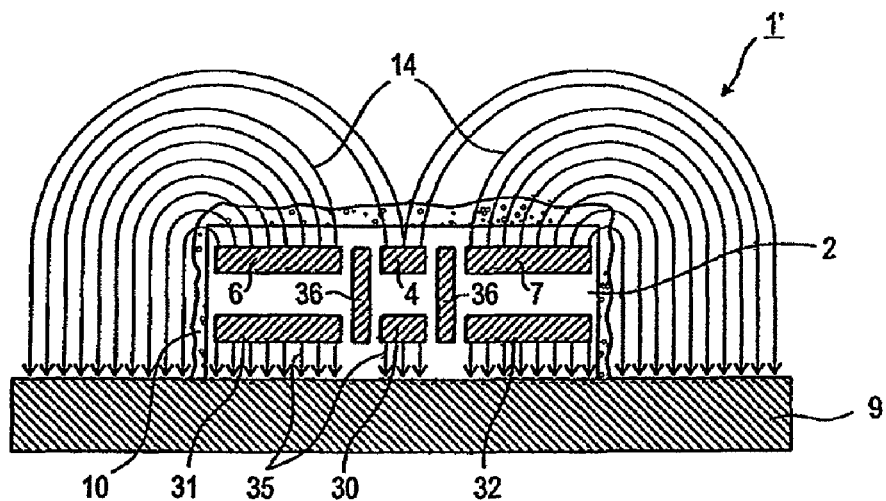
FIG. 4 illustrates in a cross section schematically another anti-pinch sensor with a shielding electrode and the course of the field lines in a measurement phase.

To increase the stray field of the capacitors formed by measuring electrodes 4, 6, and 7, a shielding electrode is introduced between measuring electrodes 4, 6, and 7 and counter electrode 9 in anti-pinch sensor 1' depicted in a cross section according to FIG. 4. In this case, the shielding electrode is divided into a first, second, and third shielding electrode 30, 31, or 32, each of which is assigned to the corresponding electrodes 4, 6, and 7. Via a suitable circuit (not shown here), it is achieved by circuitry means that in the measurement phase shielding electrodes 30, 31, and 32 are at the same potential as electrodes 4, 6, or 7. In other words, shielding electrodes 30, 31, and 32 are used as driven shield electrodes. Based on the resulting potential ratios, therefore screening electrodes 30, 31, and 32 prevent the formation of a direct capacitance or a direct electric measuring field 14 between measuring electrodes 4, 6, and 7 and counter electrode 9. Thus, via measuring electrodes 4, 6, and 7 in each case a stray field to counter electrode 9 is generated, which is directed to the side facing away from counter electrode 9 into a hazard region to be detected by anti-pinch sensor 1'. The sensitivity in the detection region of anti-pinch sensor 1' is considerably increased compared with the sensitivity in the detection region of anti-pinch sensor 1. Measuring field 14 is generated by shielding electrodes 30, 31, and 32 to counter electrode 9, which is illustrated by the correspondingly drawn field lines of direct electric field 35.

Anti-pinch sensor 1' also comprises a flat sensor body 2, extending in the longitudinal direction and made of an electrical insulating material. Sensor body 2 is placed in turn on a counter electrode 9. Inner calibrating electrode 4 and measuring electrodes 6 and 7 are each formed as flat conductors. Likewise, shielding electrodes 30, 31, and 32 are formed as flat conductors, which are assigned to the corresponding measuring electrodes 4, 6, or 7. All flat conductors extend perpendicular to the plane of the drawing.

Furthermore, two additional electrodes 36 are provided, which are connected to the same potential in the measurement phase as electrodes 4, 6, and 7 and shielding electrodes 30, 31, and 32.

A dirt deposit on the surface of sensor body 2 or a water film wetting the surface causes a change in the measurement capacitance of the capacitor comprising electrodes 4, 6, and 7 and counter electrode 9. In contrast to an obstacle in the path of the actuating element, deposit 10 lies directly above sensor body 2, however. Whereas the obstacle is a far-field disturbance, deposit 10 influences only the near field. To be able to detect only the near-field disturbance caused by deposit 10, in a calibration phase a second electric field, a calibration field 38, is created whose range above sensor body 2 is smaller than that of measuring field 12. This is achieved by applying different potentials to calibrating electrode 4 and measuring electrodes 6, 7, so that the field lines of calibration field 38 extend from calibrating electrode 4 in the direction of measuring electrodes 6, 7, as can be derived from FIG. 5.

Due to the central arrangement of calibrating electrode 4, in this embodiment variant, the field lines of calibration field 38 extend toward both sides of the sensor body (2) side facing away from counter electrode 9 in the direction of measuring electrodes 6, 7 and essentially do not reach counter electrode 9, so that calibration field 38 forms above sensor body 2.

In the calibration phase, both additional electrodes 36 and shielding electrode 30 are at the same potential as calibrating electrode 4 and thereby shield calibrating electrode 4 relative to counter electrode 9, measuring electrodes 6, 7, and possibly shielding electrodes 31, 32. Additional electrodes 36 in particular prevent the formation of a direct electric field between calibrating electrode 4 and measuring electrodes 6, 7 positioned nearby. Shielding electrodes 31, 32 are connected, e.g., to the same potential as measuring electrodes 6 and 7, but may also have a different potential.

Different potentials can be achieved at calibrating electrode 4 and measuring electrodes 6, 7 by supplying, for example, electrodes 4, 6, 7 with AC voltage; in this case, the AC voltage of calibrating electrode 4 differs from that of measuring electrodes 6, 7 in their phase or frequency.

Figure 6:
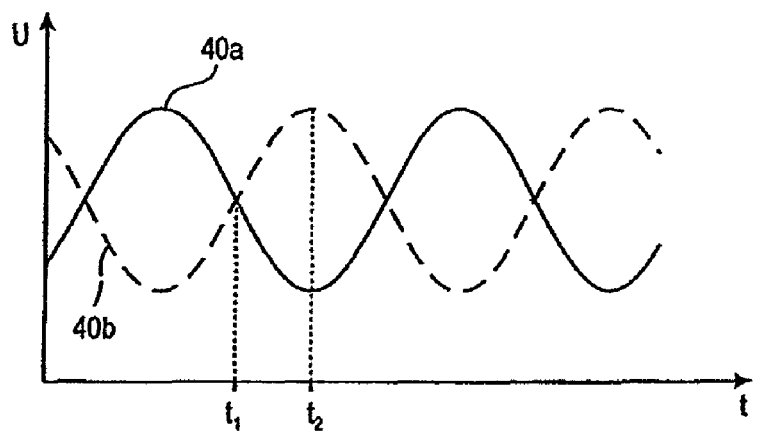
FIG. 6 illustrates a time course of two AC voltage signals.

An example of the course of two AC voltage signals 40$a$, 40$b$, which are supplied accordingly to calibrating electrode 4 and measuring electrodes 6, 7 and differ in their phase to one another by $\pi$, is illustrated in FIG. 6. The curves of the course of both AC voltages 40$a$, 40$b$ intersect at time $t_1$. At time $t_2$, the amplitude of the two AC voltage signals 40$a$, 40$b$ is the greatest; i.e., the calibration field between calibrating electrode 4 and measuring electrodes 6, 7 is the most intense. A conclusion can be reached on the calibration capacitance from the course of the measurement capacitance overall with this type of control and this can be used to adjust a triggering threshold for the measurement capacitance.

To control AC voltages 40$a$, 40$b$, a controllable voltage source (not shown here) is provided which is controlled accordingly by a control unit. The control unit can be formed in particular as a microcontroller. The control unit in this exemplary embodiment also plays the role of an evaluation unit, although separate units can also be used as a control unit and evaluation unit. From the calibration phase, the control unit detects the calibration capacitance of the calibration field formed between calibrating electrode 4 and measuring electrodes 6, 7 and compares its value with the value from the last calibration capacitance measurement. If changes are found in this comparison, these indicate the presence of a deposit 10 of dirt or water on the surface of sensor body 2.

The determined value of the calibration capacitance is stored, furthermore, and taken into account in the evaluation of the measurement capacitance in the measurement phase. During the evaluation of the determined measurement capacitance, therefore, the triggering threshold is tracked, the exceeding of which by the currently measured measurement capacitance is interpreted as a presence of an obstacle in the path of the actuating element. To avoid misdetection of an obstacle, this triggering threshold is updated depending on the measured calibration capacitance, because a change in the calibration capacitance also leads to a changed expected value of the measurement capacitance during normal operation. The effect of the calibration capacitance on the measurement capacitance depends on the structure and the dimensioning of anti-pinch device 1' and essentially can be determined for the system. Thus, e.g., a software-based tracking of the triggering threshold is possible, in which the course of the measurement capacitance and thereby the triggering threshold can be adjusted to the course of the calibration capacitance. Alternatively, only the course of the triggering threshold is updated depending on the course of the calibration capacitance and used in the evaluation of the measurement capacitance.

Alternatively, to connect electrodes 4, 6, 7 with AC voltages of a different phase and/or frequency, measuring electrodes 6, 7 can be connected to a ground potential, particularly to ground, during the measurement phase. The setting of the measurement and calibration phases in this case can also occur periodically, particularly alternately.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A capacitive anti-pinch sensor for detecting an obstacle in a path of an actuating element of a motor vehicle, the anti-pinch sensor comprising:
   a sensor body with an electrically isolated measuring electrode that is provided in the sensor body and to which a measuring potential can be applied;
   a calibrating electrode, which is provided in the sensor body, directly adjacent to the measuring electrode and to which a calibrating potential can be applied; and
   a control unit, which controls the measuring electrode and the calibrating electrode so that the measuring potential and the calibrating potential are substantially equal in a measurement phase and differ from one another in a calibration phase, wherein the control unit measures and stores a value of a calibration capacitance during the calibration phase of the capacitive anti-pinch sensor, and uses the measured calibration capacitance value to correct the value of a measurement capacitance detected in the measurement phase of the capacitive anti-pinch sensor, to account for the presence of water, dirt or other contaminants on a surface of the sensor body.

2. The anti-pinch sensor according to claim 1, wherein the control unit is configured to control each of the measuring electrode and the calibrating electrode with an AC voltage, wherein the AC voltages differs from one another in their phases or in their frequencies.

3. The anti-pinch sensor according to claim 1, wherein the control unit is configured to connect the measuring electrode to a ground potential in the calibration phase.

4. The anti-pinch sensor according to claim 1, wherein the control unit is a microcontroller.

5. The anti-pinch sensor according to claim 1, wherein the measuring electrode and the calibrating electrode are each formed comb-shaped, whereby the comb structures of the measuring electrode and calibrating electrode interdigitate.

6. The anti-pinch sensor according to claim 1, wherein the measuring and calibrating electrodes are formed flat and the surface area of the measuring electrode is greater than the surface area of the calibrating electrode.

7. The anti-pinch sensor according to claim 1, wherein two measuring electrodes, particularly two structurally identical measuring electrodes, are provided, which are disposed in edge regions of the sensor body.

8. The anti-pinch sensor according to claim 1, which comprises at least one separate shielding electrode, which is configured to direct a measuring field into a hazard region in the measurement phase.

9. The anti-pinch sensor according to claim 8, wherein the shielding electrode is configured to direct a calibration field into a near zone in the calibration phase.

10. The anti-pinch sensor according to claim 8, wherein the shielding electrode is divided into individual, separated single shielding electrodes, each arranged opposite the measuring and calibration electrodes.

11. The anti-pinch sensor according to claim 1, further comprising an additional electrode between the calibrating electrode and the measuring electrode, the additional electrode have substantially a same potential applied as a potential to the calibrating electrode.

12. The anti-pinch sensor according to claim 1, wherein the sensor body is made of a flexible support material.

13. The anti-pinch sensor according to claim 1, wherein the anti-pinch sensor is formed as a flexible flat cable.

14. The anti-pinch sensor according to claim 12, wherein the sensor body comprises a flexible conductor structure.

15. The anti-pinch sensor according to claim 1, wherein the sensor body extends in a substantially longitudinal direction, and the electrodes are divided along the longitudinal direction each into individually controllable single electrodes.

16. The anti-pinch sensor according to claim 1, further comprising a counter electrode provided opposite to the measuring electrode and the calibrating electrode, the counter electrode being formed by a body of the motor vehicle.

17. A method for detecting an obstacle in a path of an actuating element of a motor vehicle using a capacitive anti-pinch sensor, the method comprising:
  applying a measuring potential to an electrically isolated measuring electrode provided in a sensor body that is part of the capacitive anti-pinch sensor;
  applying a calibrating potential to a calibrating electrode provided in the sensor body adjacent to the measuring electrode, the measuring potential and the calibrating potential being substantially equal in a measurement phase and differing from one another in a calibration phase;
  measuring and storing a value of a calibration capacitance during the calibration phase, and
  correcting a value of a measurement capacitance using the stored value of the calibration capacitance.

* * * * *